United States Patent [19]
Hokari

[11] Patent Number: 5,748,448
[45] Date of Patent: May 5, 1998

[54] SOLID-STATE IMAGE SENSOR ASSEMBLY WITH IMAGE SENSOR ELEMENT CHIP MOUNTED IN PACKAGE

[75] Inventor: Yasuaki Hokari, Tokyo, Japan

[73] Assignee: NEC Corporation, Tokyo, Japan

[21] Appl. No.: 604,416

[22] Filed: Feb. 21, 1996

[30] Foreign Application Priority Data

Feb. 21, 1995 [JP] Japan .................... 7-032173

[51] Int. Cl.⁶ .............. H05K 7/02; H05K 1/03; H01L 31/0203; H01L 31/0232
[52] U.S. Cl. .......... 361/749; 361/783; 174/52.4; 257/432; 257/433; 396/542
[58] Field of Search ........................ 361/813, 820, 361/749, 783; 174/52.4, 52.5, 52.6, 254; 257/680, 681, 432, 433, 434; 348/374, 375; 396/542

[56] References Cited

U.S. PATENT DOCUMENTS 4,296,457  10/1981  Hahlganss ................... 361/749
5,220,198  6/1993  Tsuji .......................... 257/680
5,253,010  10/1993  Oku et al. ................... 396/542

FOREIGN PATENT DOCUMENTS 62-104075  5/1987  Japan .................... H01L 27/14

*Primary Examiner*—Leo P. Picard
*Assistant Examiner*—John B. Vigushin
*Attorney, Agent, or Firm*—Sughrue, Mion, Zinn, Macpeak & Seas, PLLC

[57] ABSTRACT

The solid-state image sensor disclosed includes a package accommodating an image sensor element chip, and a plurality of wiring patterns carried by a flexible printed wiring circuit board. Each of the wiring patterns is a continuous seamless pattern and has electrode portions for connection with the element chip and for connection with circuit components, and a wiring portion disposed between those electrode portions. The flexible printed wiring circuit board is capable of being bent, extends through and out from the package, and is unitary with the package. The arrangement enables the compact accommodation of the element chip together with other components and the reduction in the number of steps for the fabrication.

8 Claims, 6 Drawing Sheets

SOLID-STATE IMAGE SENSOR ASSEMBLY WITH IMAGE SENSOR ELEMENT CHIP MOUNTED IN PACKAGE

BACKGROUND OF THE INVENTION

1. Field of the Invention

The present invention relates to a solid-state image sensor, and more particularly to a solid-state image sensor assembly in which an image sensor element chip is mounted in a package and which permits compact accommodation of the element chip together with ICs and circuit components in a peripheral circuit in a camera housing.

2. Description of the Related Art

There have been advances in smaller sized and lighter weight image sensor cameras and, in consumer CCD type (charge transfer type) image sensors, the optical system size has been reduced from ½ inch to ⅓ inch and further to ¼ inch. There have been significant effects as a result of the application of small sized cameras, which have enabled the realization, for example, of small-sized gastrocamera and door phones and further, portable personal computers with built-in cameras. As an example, in the ¼ inch image sensor, the size of the image area is 3.4 mm×2.6 mm. Using such a small image sensor, it is possible to realize a camera as small as a fingertip. However, the camera size reduction cannot be achieved by merely reducing the size of the image sensor element chip. To this end, it is also necessary to use techniques for reducing the size of camera lenses and other components that are mounted in the camera and also compactly accommodating these components in a small space.

An example of a prior art solid-state image sensor is shown in a sectional view in FIG. 1A. The illustrated image sensor has an image sensor element chip which is assembled in a package. Designated by 1 is an image sensor element chip, by 2 a package accommodating the element chip 1, by 3 metal leads of the package, by 4 electrodes provided in the package 2 and electrically connected to the metal leads 3, by 5 bonding wires interconnecting electrodes (i.e., bonding pads) provided on the chip 1 and package side electrodes 4, by 6 a glass cap provided on the package, and by 7 a light-shielding film provided on the glass cap 6.

The image sensor element chip 1 is bonded to the package 2 in the inside thereof by a conductive silver paste or a non-conductive epoxy resin. Afterwards, the bonding wires 5 are connected using well-known techniques. Then, the glass cap 6 is bonded to the package 2 using an adhesive. The light-shielding film 7 which is disposed underneath the glass cap 6, blocks light in other areas than the light reception area of the solid-state image sensor, thus preventing ghost images that might otherwise be generated by light reflected by the surfaces of the bonding wires 5, electrodes 4, etc.

FIG. 1B is a perspective view showing an example of an assembly in which the above package with the sensor element chip assembled therein and IC as drive circuits and signal processing circuits are mounted on a printed circuit board. In FIG. 1B, designated by 10A is a package (solid-state image sensor) with a sensor element chip assembled therein, by 20 a printed wiring circuit board, by 30A IC as signal generation circuits and drive circuits for driving the package or image sensor 10A, by 30B IC as a signal processing circuit for processing signal from the package 10A, and by 8 a camera lens.

The solid-state image sensor 10A with the sensor element chip is mounted together with the ICs 30A and 30B on the printed wiring circuit board 20. The camera lens 8 is disposed above the image sensor 10A. An image pattern is projected onto an image area of the image sensor 10A. Light intensity changes of the image pattern are converted by pulse voltage application by the IC 30A and signal processing in the IC 30B into an electric signal as an output.

With the assembly shown in FIG. 1B, however, it is difficult to realize a small-size camera head because the solid-state image sensor and IC chips are mounted on the printed wiring circuit board 20 which is a flat member. Certain techniques are therefore demanded for realizing a small-size camera head. An example of such techniques is shown in Japanese Patent Application Kokai Publication No. Sho 62-104075. This publication discloses an image sensor having a sectional structure as shown in FIG. 2. In FIG. 2, designated by 1 is an image sensor element chip, by 11 a package board, by 5A and 5B bonding wires, by 22 a flexible printed wiring board, 31A, 31B and 31C component chips soldered to or likewise mounted on the printed wiring board 22, and by 9 a lead wire. In this example, the image sensor element chip 1 is secured by a die bonding adhesive to the package board 11, and bonding pads (not shown) on the element chip 1 and electrodes (not shown) on the side of the package board 11 are electrically interconnected by the bonding wires 5A and 5B. The board 11 and the printed wiring board 22 are bonded to each other by an adhesive. Input/output terminals (not shown) of the element chip 1 provided on the back surface of the board 11 and electrodes (not shown) on the printed wiring board 22 are interconnected by soldering. In this example of image sensor, the three component chips 31A, 31B and 31C are mounted on both the surfaces of the flexible printed wiring board 22 which is capable of being bent. This means that more compact mounting is possible compared to the prior art image sensor shown in FIG. 1B.

The Japanese Patent Application Kokai Publication No. Sho 62-104075 shows another solid-state image sensor which permits more compact mounting. In FIG. 3, designated by 1 is an image sensor element chip, by 11 a package board, by 6 a glass cap, 5A and 5B bonding wires, by 23 a glass epoxy board, by 31A, 31B and 31C component chips, by 9A and 9B lead wires, by 3A and 3B metal leads secured to the package board 11, and by 40 a camera housing. In this example shown in FIG. 3, the element chip 1 is secured by adhesive to the package board 11, and bonding pads (not sown) on the side of the element chip 1 and electrodes (not shown) on the side of the package board 11 are electrically interconnected by the bonding wires 5A and 5B. The electrodes on the side of the package board 11 are electrically connected to the metal leads 3A and 3B which extend downward from the back surface of the package board 11. To the metal leads 3A and 3B, the glass epoxy board 23 with the component chips 31A, 31B and 31C mounted thereon and the lead wires 9A and 9B are connected for voltage supply and for taking out signals. The camera housing 40 of this image sensor example has a cylindrical or prismatic outer shape. The glass cap 6 is mounted on an end surface of the image sensor serving as a light incidence surface. With this image sensor, it is possible to realize a camera smaller than the image sensor having the structure as shown in FIG. 2.

As shown above, the conventional mounting of the image sensor element chip in the camera housing is made by assembling the image sensor element chip in the package or mounting the element chip on the package board, then directly soldering the package or package board with the element chip to the printed wiring circuit board or bonding and then soldering the two together, then mounting ICs, component chips and other components on the printed wiring circuit board to complete the solid-state image sensor assembly, and then assembling the completed image sensor assembly into the camera housing. In such a structure, the current path leading from the element chip to the printed wiring circuit board is not constituted by a continuous conductor, but a connection means for electrically connecting two different conductors. In any of the prior art structures described above, it is necessary to provide connection means for connecting the package (or package base) and the printed wiring circuit board to each other, in addition to bonding wires also as connection means for connecting the image sensor element chip and the package (or package board).

Specifically, in the solid-state image sensor shown in FIG. 1B, the metal lead 3 of the package 10A and an electrode (not shown) on the side of the printed wiring circuit board 20 are soldered to each other in a portion shown enclosed in a broken line circle 50A. In the solid-state image sensor shown in FIG. 2, an image sensor input/output terminal provided on the back surface of the package board 11 and an electrode on the side of the flexible printed wiring circuit board 22 are soldered to each other in, for example, a portion enclosed as shown by the broken line circle 50B. In the solid-state image sensor shown in FIG. 3, the metal leads 3A and 3B on the side of the package board 11 and electrodes on the side of the glass epoxy board 23 are soldered to each other in a portion enclosed as shown by the broken line circle 50C.

In the above structures, typically in the image sensor shown in FIGS. 1A and 1B in which the package 10A with the element chip mounted thereon and the printed wiring circuit board 20 are directly soldered to each other, an electrode part for the soldering is necessary on the printed wiring circuit board 20, which is undesired for the size reduction.

Also, in the FIG. 2 structure in which the package board 11 is secured by adhesive to the flexible printed wiring circuit board 22, soldering is necessary for the electric connection of the two, so that compact assembling is difficult. Besides, the provision of solder on the connection part generates stress. This imposes limitation on the curvature angle of the flexible printed wiring circuit board when the board is bent, thus making it difficult to obtain compact assembling of the image sensor in the housing.

Moreover, in any of the above structures inclusive of the FIG. 3 structure, steps for mounting on and connection to the printed wiring circuit board are necessary after the mounting of the image sensor element chip in the package (or on the package board) and before the mounting of the package or package board in the camera housing, thus making it difficult to reduce the number of steps and the cost of manufacture.

SUMMARY OF THE INVENTION

An object of the invention is to provide a solid-state image sensor, which permits reduction of the size and cost of manufacture of cameras.

According to one aspect of the invention, there is provided a solid-state image sensor which comprises:

an image sensor element chip;

a package which accommodates the image sensor element chip;

a plurality of wiring patterns each of which is in a continuous seamless pattern having an inner side electrode portion disposed inside the package and used for electrical connection with the image sensor elements chip, an outer side electrode portion disposed outside the package and used for electrical connection with circuit components, and a wiring portion disposed between the inner side electrode portion and the outer side electrode portion; and a flexible printed wiring circuit board which carries the wiring patterns and which is capable of being bent;

the flexible printed wiring circuit board carrying the image sensor element chip and extending through and out from the package, and the flexible printed wiring circuit board and the package being unitary formed.

According to another aspect of the invention, there is provided a solid-state image sensor in which a surface of the flexible printed wiring circuit board opposite to a surface on which the image sensor element chip is mounted constitutes a mounting surface for mounting various parts including ICs and circuit components for driving the image sensor element chip and processing signals therefrom.

According to the invention, the package accommodating the image sensor element chip has a flexible printed wiring circuit board extending as a one-piece through it and to its outside. The printed wiring circuit board has an electrode portion for connection to the element chip, an electric wiring portion for connection to ICs and other components that are mounted, and further an electrode portion for mounting these components, these portions being provided as a continuous wiring pattern. The element chip and the printed wiring circuit board thus can be interconnected by merely the bonding pads of the element chip and the electrode portions of the printed wiring circuit board. Thus, no specific structure for interconnecting the package and the printed wiring circuit board is necessary.

In other words, according to the invention, the connection means that are necessary are less by at least one compared to the prior art solid-state image sensor, so that the space necessary for mounting the components on the printed wiring circuit board is reduced correspondingly. In addition, a portion in which stress is generated by the provision of solder is reduced to increase the freedom of bending of the flexible printed wiring circuit board. It is thus possible to make sufficient use of the advantages of using the flexible printed wiring circuit board for the camera size reduction. This also permits reduction of the number of connection steps for reducing the cost of manufacture.

Moreover, by mounting other components on the back side of the flexible printed wiring circuit board (the side opposite to the element chip mounting side) and then folding the printed wiring circuit board toward the back side, a structure is obtained wherein the other mounted components are positioned underneath the package accommodating the element chip. It is thus possible to obtain compact accommodation of the solid-state image sensor with the other components mounted therein in the camera housing.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the accompanying drawings.

Figure 1A:
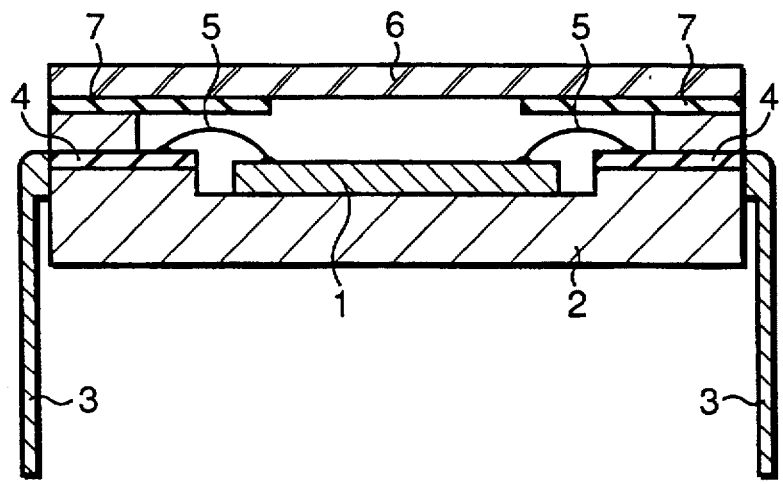
FIG. 1A is a diagrammatic sectional view showing an example of a prior art structure of a solid-state image sensor in which an image sensor element chip is mounted.
Figure 1B:
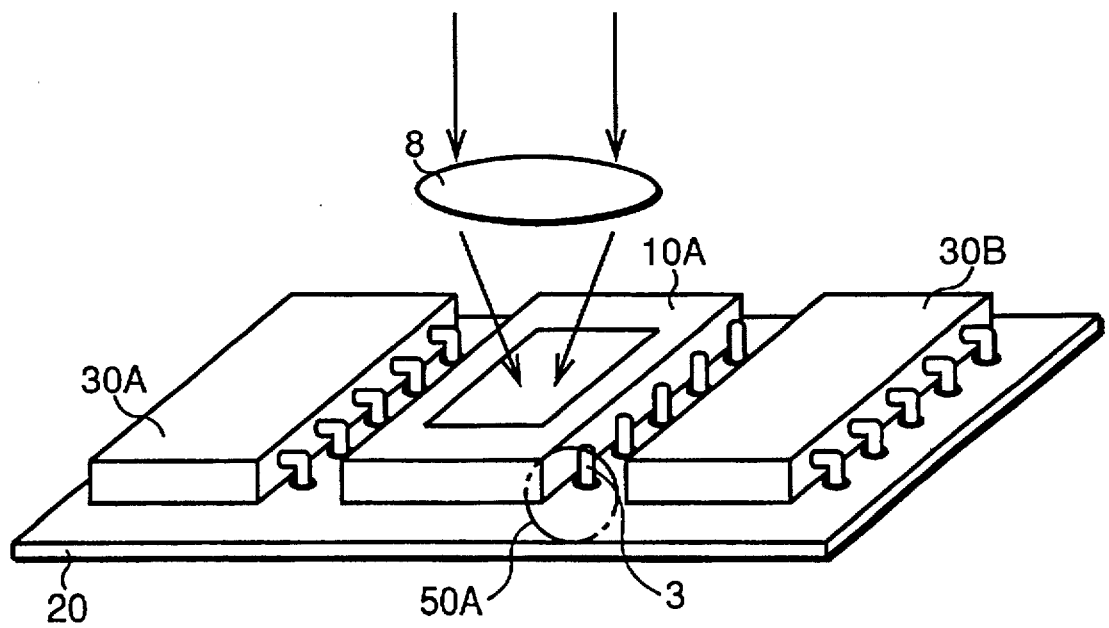
FIG. 1B is a perspective view of prior art structure with a solid-state image sensor mounted on a printed wiring circuit board.
Figure 2:
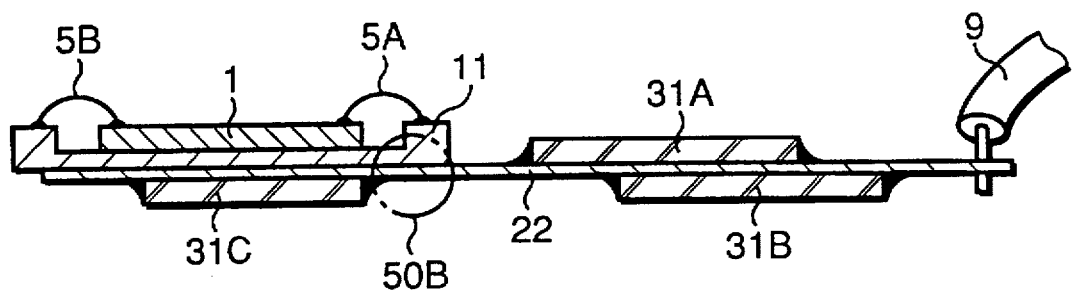
FIG. 2 is a diagrammatic sectional view showing another example of a prior art structure with an image element chip mounted on a package board.
Figure 3:
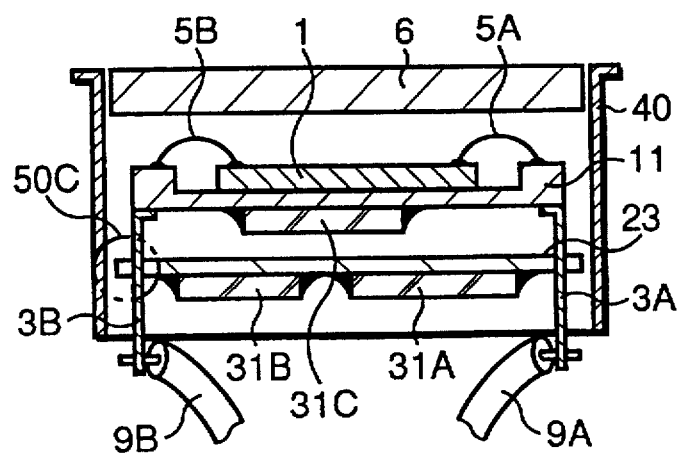
FIG. 3 is a diagrammatic sectional view showing still another example of a prior art structure with an image element chip mounted in a package.
Figure 4A:
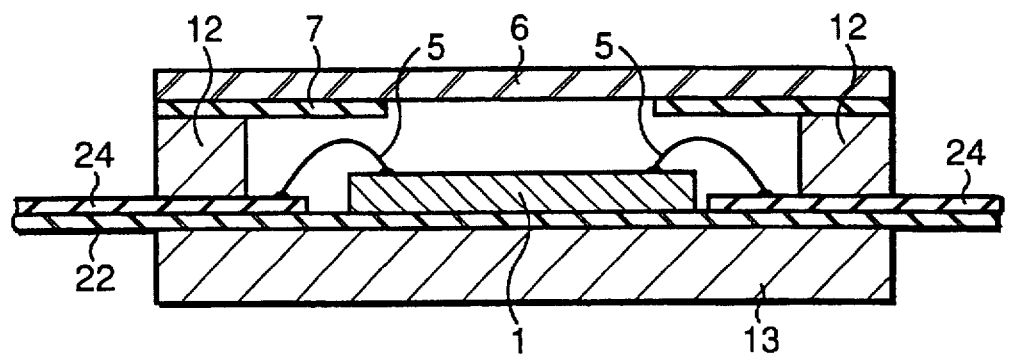
FIG. 4A is a diagrammatic sectional view (taken along line 4A—4A in FIG. 4B) showing a structure of a first embodiment of the invention.
Figure 4B:
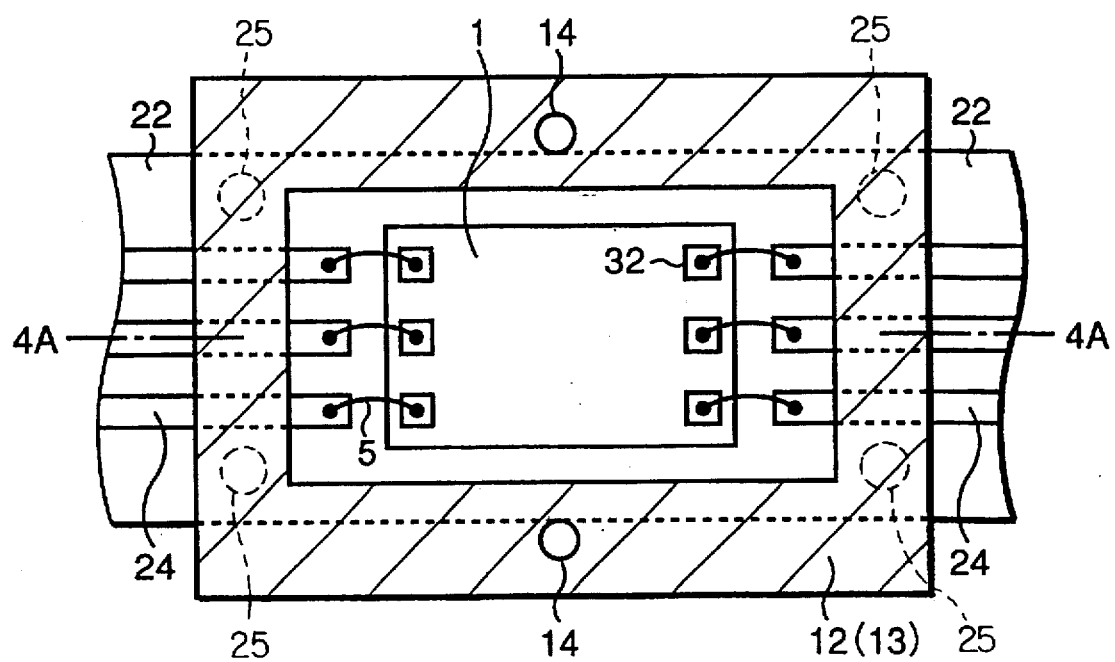
FIG. 4B is a diagrammatic plan view showing the same.

FIG. 4A shows, in a sectional view, a structure of a first embodiment of the invention, and FIG. 4B shows the same in a plan view. Here, designated by 1 is an image sensor element chip, by 22 a flexible printed wiring circuit board capable of being bent, by 24 a plurality of wiring patterns provided on the printed wiring circuit board 22, by 12 a package frame, by 13 a package board, by 5 bonding wires, by 6 a glass cap, and by 7 a light-shielding film provided on the glass cap.

The package frame 12 which is mounted on the flexible printed wiring circuit board 22 on the side on which the image sensor element chip 1 is mounted, and the package board 13 provided on the opposite side, are secured to the flexible printed wiring circuit board 22. The package frame 12 and the package board 13 are molded into a unitary body by press molding die using an epoxy resin. Preferably, in order to reinforce the adhesive force between the package frame 12 and the package board 13, the printed wiring circuit board 22 is provided, in the portion sandwiched by the package frame 12 and the package board, 13 with a plurality of through holes 25 that are formed so as not to interfere with the formation of the wiring patterns 24, in which case the resin material of the package frame 12 and that of the package board 13 can be in direct contact with each other. It is desirable that the resin materials used for the package frame 12 and package board 13 contain a black pigment in order to prevent incidence of unnecessary light on the element chip 1. Normal glass epoxy resins which may be used for the printed wiring circuit board 22 transmit light.

Therefore, when the printed wiring circuit board 22 is as thick as, for instance, 0.5 mm or greater, light transmitted through the printed wiring circuit board 22 from the package end may enter the inside of the package and have adverse effects on the image sensing characteristics. It is thus desirable that the printed wiring circuit board 22 also contains a black pigment for preventing the light transmission.

The image sensor element chip 1 is secured by an epoxy resin to the flexible printed wiring circuit board 22. Alternatively, it may be secured using conductive adhesive such as silver paste to electrodes provided on the printed wiring circuit board 22 in a chip mounting part thereof. The wiring patterns 24 on the printed wiring circuit board 22 can be connected with the element chip 1 using well-known techniques, i.e., using bonding wires 5. The glass cap 6 is secured by adhesive to the package frame 12. The light-shielding film 7 is provided on the glass cap 6 to prevent incidence of unnecessary light on the element chip 1 in the area thereof other than the imaging area.

FIG. 4B is a plan view of this first embodiment. In the FIG. 4B, designated by 32 are bonding pads provided on the image sensor element chip 1, and by 14 holes provided in the package frame 12 and the package board 13. FIG. 4A is a sectional view taken along line 4A—4A in FIG. 4B. The holes 14 are formed in the package frame 12 and the package board 13 so as not to interfere with the formation of the wiring patterns 24, and are used for the purpose of positioning when mounting the element chip 1 on the package, and they further serve as set screw holes when mounting the package in the camera housing. The glass cap 6 is mounted on the package frame 12. Holes may be formed in the glass cap 6 at positions corresponding to the holes 14 of the package. Alternatively, a smaller glass cap may be used to avoid the holes. For the purpose of the positioning of the chip on the frame 12, positioning marks may be provided on appropriate parts of the frame 12.

Figure 5:
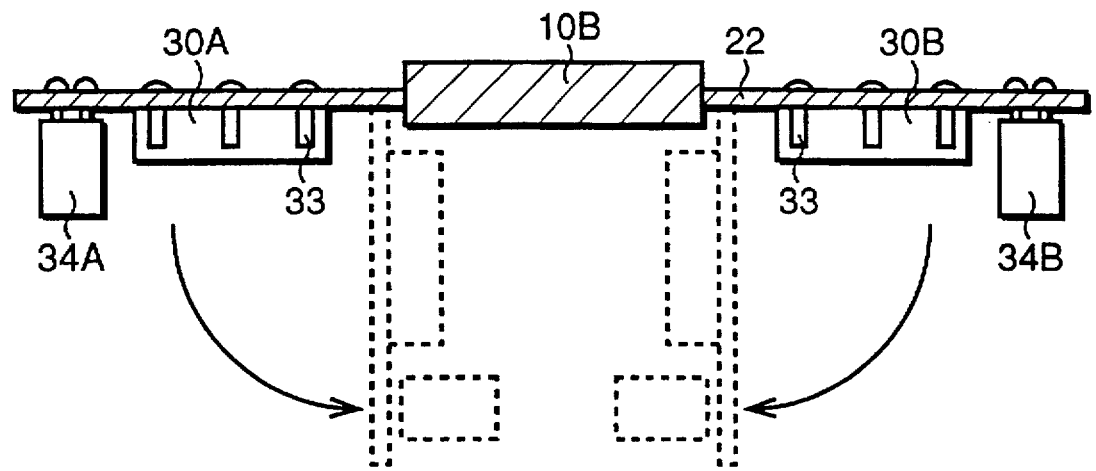
FIG. 5 is a diagrammatic side view, partially in section, showing an example of a solid-state image sensor of the first embodiment in a state wherein other components are mounted on the flexible printed wiring circuit board shown in FIG. 4A.

Now, an example of structure in which the solid-state image sensor shown in FIGS. 4A and 4B is assembled and mounted together with ICs and other circuit components in peripheral circuit, will be described. FIG. 5 is a side view showing an example of a solid-state image sensor, which is obtained by mounting ICs and circuit components in the flexible printed wiring circuit board 22 in the FIGS. 4A and 4B solid-state image sensor. In FIG. 5, designated by 10B is a package with an image sensor element chip assembled therein (see FIG. 4A for the internal structure), by 22 a flexible printed wiring circuit board, by 30A and 30B ICs, by 33 metal leads of the ICs, and 34A and 34B circuit components. The image sensor 10B is provided on the top of the printed wiring circuit board 22, and an image pattern from a camera lens (not shown) is projected from the top side. The ICs 30A and 30B and circuit components 34A and 34B are provided on the bottom of the printed wiring circuit board 22. Subsequently, the printed wiring circuit board is bent such that its bottom is made to be the inner side as shown by broken lines. In this structure, parts other than the image sensor 10B are accommodated on the side of the bottom of the image sensor 10B. Compact accommodation is thus possible.

Figure 6:
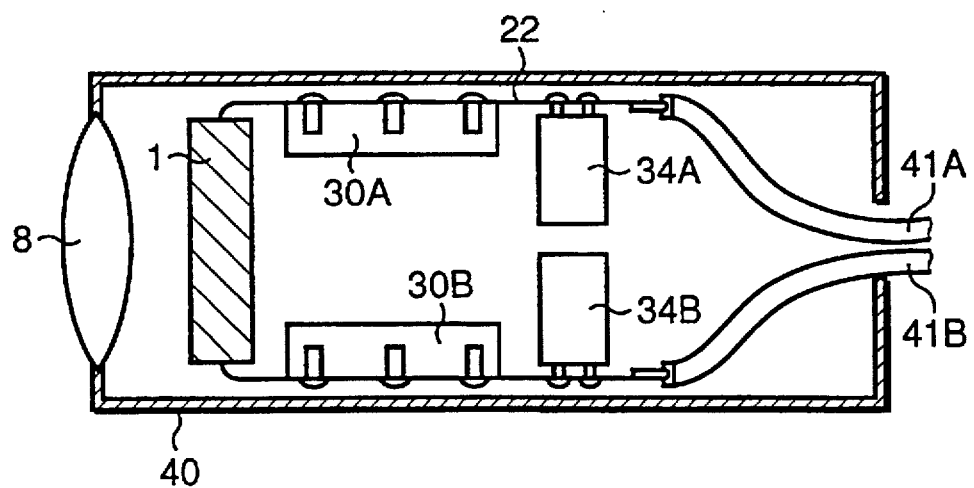
FIG. 6 is a diagrammatic side view, partly broken away, partially in section, showing an example wherein a solid-state image sensor of the first embodiment with the components mounted as shown in FIG. 5 is accommodated in a cylindrical camera housing.

FIG. 6 is a side view, partly broken away, showing an example of the internal structure in the case where the solid-state image sensor with the components mounted as shown in FIG. 5 is accommodated in a cylindrical camera housing. In FIG. 6, designated by 8 is a camera lens, and by 41A and 41B cables. Since the components (i.e., the ICs 30A and 30B and circuit components 34A and 34B) mounted on the printed wiring circuit board 22 are accommodated on the back side of the package 10B accommodating the image sensor element chip, the structure does not have any peripherally projecting part. It is thus possible to obtain sufficiently compact assembling even in the case where the camera housing 40 has a small diameter.

Figure 7A:
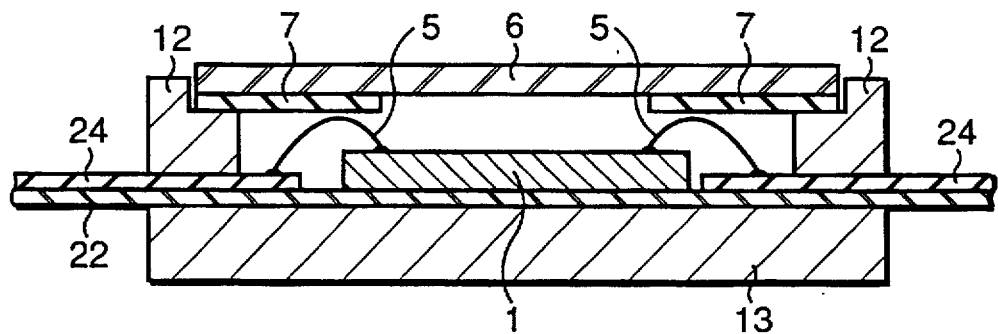
FIG. 7A is a diagrammatic sectional view (taken along line 7A—7A in FIG. 7B) showing a structure of a second embodiment of the invention.
Figure 7B:
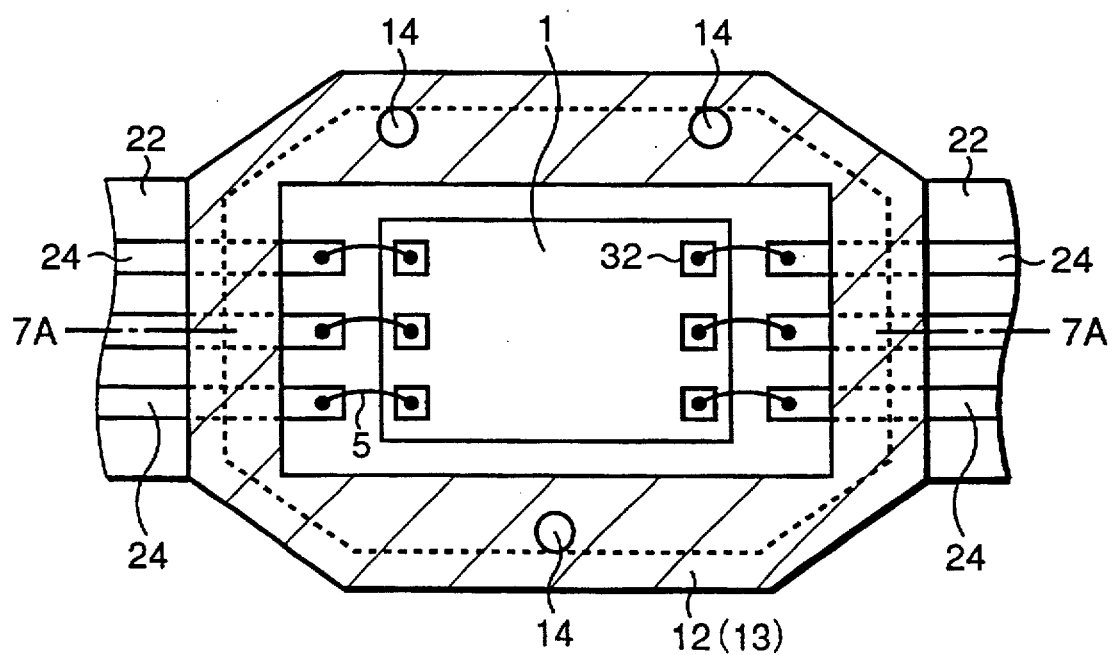
FIG. 7B is a diagrammatic plan view showing the same.

A second embodiment of the invention will now be described. FIG. 7A is a sectional view showing the second embodiment of the invention, and FIG. 7B is a plan view showing the same. The sectional view of FIG. 7A is taken along line 7A—7A in FIG. 7B. In this embodiment, the package frame 12 has a notch formed in its upper portion. The glass cap 6 is inserted in the notch and secured in position. This structure of the embodiment facilitates the positioning of the light-shielding film 7 provided on the glass cap 6 and the image area of the image sensor element chip 1 relative to each other, and enables reduction in the number of assembling steps.

Referring to FIG. 7B, in this second embodiment, the package has a different plan view structure from that in the preceding first embodiment. Specifically, in this embodiment four corners of the package are removed, so that the package can be mounted as a reduced size package in the cylindrical camera housing. In addition, in this embodiment the holes 14 are provided asymmetrically in a plan view to prevent mounting error when mounting the image sensor element chip 1 on the package or mounting the solid image sensor after the mounting of the components (for instance one shown in FIG. 5) in the camera housing. This arrangement of the holes 14 is by no means limited to this embodiment, and it is alternatively possible to secure the image sensor directly with adhesive to the camera housing.

Figure 8:
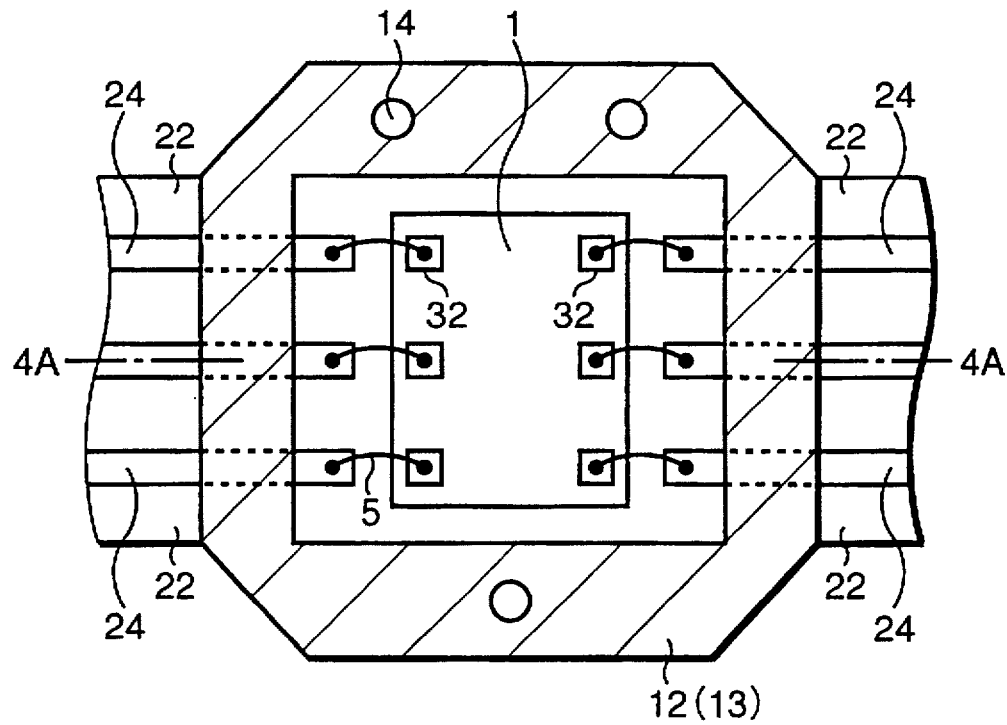
FIG. 8 is a diagrammatic plan view showing a structure of a third embodiment of the invention (a sectional view taken along line 4A—4A is the same as that shown in FIG. 4A)

FIG. 8 is a plan view showing a third embodiment of the invention. The sectional structure taken along line 4A—4A in FIG. 8 is the same as the structure in FIG. 4A. In the FIG. 4B and 7B embodiments, the bonding pads 32 are provided on the image sensor element chip 1 along the short sides thereof and connected by the bonding wires 5 to the wiring patterns 24. For its compact accommodation in a cylindrical camera housing, however, the image sensor package is desirably in a shape inscribing as small a circle as possible. In this embodiment, the bonding pads 32 are provided on the image sensor element chip 1 along the long sides thereof for connection to the wiring patterns 24. With such a structure, the package has an outer shape inscribing a minimum circle, and can be accommodated in a smaller camera housing compared to the case of the second embodiment in FIG. 7B having a similar structure.

Figure 9:
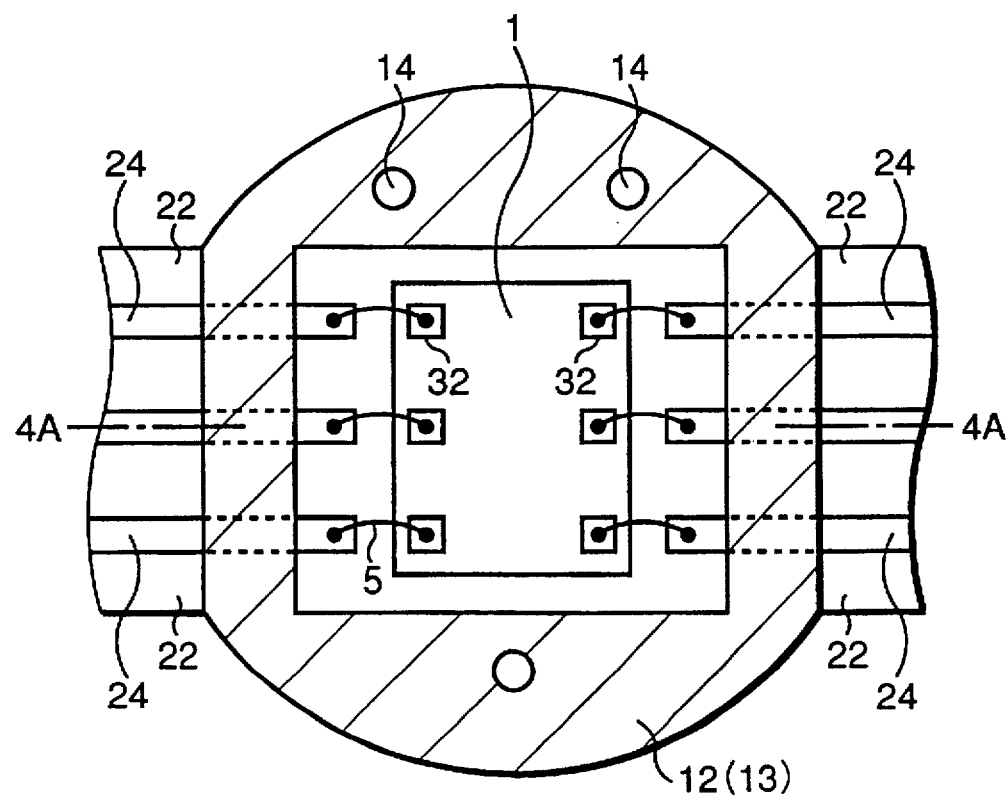
FIG. 9 is a diagrammatic plan view showing a structure of a fourth embodiment of the invention (a sectional view taken along line 4A—4A is the same as that shown in FIG. 4A).

FIG. 9 is a plan view showing a fourth embodiment of the invention. The sectional structure taken along line 4A—4A in FIG. 9 is the same as the FIG. 4A structure. The package in the third embodiment shown in FIG. 8 has a rectangular shape with chamfered corners. In contrast, the package in this embodiment has an outer shape which is based on a circular shape. This shape further facilitates the accommodation and securing of the package in the cylindrical camera housing.

The FIG. 6 example has been explained as a case wherein the FIG. 5 solid-state image sensor is assembled in the cylindrical camera housing by bending the flexible printed wiring circuit board 2. Alternatively, it is possible to realize a small-size camera by assembling the package in a plate-like form as shown in FIG. 5 in a thin camera housing. The solid-state image sensor as the embodiments described so far, can all be effectively used for the camera of the form as described.

As has been described in the foregoing, according to the invention the image sensor element chip can be compactly mounted on the printed wiring circuit board. It is thus possible to accommodate a solid-state image sensor, in which other components have been mounted, in a smaller camera housing for realizing a very small camera head.

In addition, since the package accommodating the image sensor element chip can be molded such that it is unitary with the printed wiring circuit board, it is possible to simplify the steps of assembling, mounting and accommodating, thus permitting reduction in the number of manufacturing steps and the cost.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A solid-state image sensor which comprises:
   an image sensor element chip;
   a package which accommodates said image sensor element chip;
   a plurality of wiring patterns each of which is in a continuous seamless pattern having an inner side electrode portion disposed inside said package and used for electrical connection with said image sensor element chip, an outer side electrode portion disposed outside said package and used for electrical connection with circuit components, and a wiring portion disposed between said inner side electrode portion and said outer side electrode portion;
   a flexible printed wiring circuit board made of a light-shielding resin material, which carries said wiring patterns and which is capable of being bent;
   said flexible printed wiring circuit board carrying said image sensor element chip and extending through and out from said package, and said flexible printed wiring circuit board and said package being unitary formed.

2. A solid-state image sensor according to claim 1, in which said image sensor element chip and said circuit components are mounted both on said flexible printed wiring circuit board, and only said image sensor element chip and that portion of said flexible printed wiring circuit board at which said image sensor element chip is mounted are selectively packaged within said package.

3. A solid-state image sensor according to claim 1, in which said package in a plan view is shaped in one of a rectangular shape, a four corner chamfered rectangular shape, and a circular shape.

4. A solid-state image sensor according claim 1, in which a surface of said flexible printed wiring circuit board opposite to a surface on which said image sensor element chip is mounted constitutes a mounting surface for mounting various parts including ICs and circuit components for driving said image sensor element chip and processing signals therefrom.

5. A solid-state image sensor having at least one solid-state image sensor element chip accommodated in a package, said package comprising:
   a flexible printed wiring circuit board which extends through and out from said package, is capable of being bent, has an intermediate portion on which said image sensor element chip is mounted, and has an upper surface on which a plurality of wiring patterns each extending through and out from said package are disposed;
   a package board which is disposed on an underside of said flexible printed wiring circuit board and which supports an entire surface of said flexible printed wiring circuit board; and a package frame which is disposed on said upper surface of said flexible printed wiring circuit board and which surrounds said image sensor element chip, said package board and said package frame being made of a light-shielding resin material and being unitary formed with said flexible printed wiring circuit board interposed therebetween.

6. A solid-state image sensor according to claim 5, in which said package frame is provided with holes formed in said package frame and said package board penetrating said package for positioning said image sensor element chip in said package.

7. A solid-state image sensor according to claim 5, which comprises a glass cap for the package and in which said package frame has notches formed in its upper portion such that said glass cap is inserted and positioned at said notches.

8. A solid-state image sensor having at least one solid-state image sensor element chip accommodated in a package, said package comprising:

a flexible printed wiring circuit board which extends through and out from said package, is capable of being bent, has an intermediate portion on which said image sensor element chip is mounted, and has an upper surface on which a plurality of wiring, patterns each extending through and out from said package are disposed;

a package board which is disposed on an underside of said flexible printed wiring circuit board and which supports an entire surface of said flexible printed wiring, circuit board;

a package frame which is disposed on said upper surface of said flexible printed wiring circuit board and which surrounds said image sensor element chip;

wherein a portion of said flexible printed wiring circuit board interposed between said package board and said package frame is provided with adhesive force reinforcement through holes formed in said flexible printed wiring circuit board, permitting direct contact between said package board and said package frame, and said package board and said package frame being unitary formed with said flexible printed wiring circuit board interposed therebetween.

* * * * *

UNITED STATES PATENT AND TRADEMARK OFFICE
CERTIFICATE OF CORRECTION

PATENT NO.   : 5,748,448
DATED        : May 5, 1998
INVENTOR(S)  : Yasuaki HOKARI It is certified that error(s) appears in the above-identified patent and that said Letters Patent is hereby corrected as shown below:

Column 10, line 1 delete "tipper" and insert --upper--.

Signed and Sealed this

Twenty-seventh Day of October, 1998

Attest:

BRUCE LEHMAN

Attesting Officer       Commissioner of Patents and Trademarks